(12) United States Patent
Akizuki et al.

(10) Patent No.: US 6,797,339 B2
(45) Date of Patent: Sep. 28, 2004

(54) METHOD FOR FORMING THIN FILM WITH A GAS CLUSTER ION BEAM

(75) Inventors: Makoto Akizuki, Ogaki (JP); Mitsuaki Harada, Ogaki (JP); Atsumasa Doi, Ogaki (JP); Isao Yamada, Himeji (JP)

(73) Assignees: Research Development Corporation of Japan, Saitama (JP); Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/351,555

(22) Filed: Jan. 27, 2003

(65) Prior Publication Data

US 2003/0143340 A1 Jul. 31, 2003

Related U.S. Application Data

(63) Continuation of application No. 09/916,304, filed on Jul. 30, 2001, now abandoned, which is a continuation of application No. 08/946,663, filed on Oct. 7, 1997, now abandoned, which is a continuation of application No. 08/757,088, filed on Nov. 26, 1996, now abandoned, which is a continuation of application No. 08/523,922, filed on Sep. 6, 1995, now abandoned.

(30) Foreign Application Priority Data

Sep. 6, 1994 (JP) .............................................. 6-213078
Mar. 27, 1995 (JP) .............................................. 7-068445

(51) Int. Cl.[7] ...................... C23C 14/08; C23C 14/10; C23C 14/48; B05D 3/06

(52) U.S. Cl. ...................... 427/562; 427/529; 427/524; 427/527; 427/533; 427/563

(58) Field of Search ................................. 427/524, 527, 427/529, 533, 562, 563, 564, 567

(56) References Cited

U.S. PATENT DOCUMENTS 4,066,527 A 1/1978 Takagi et al.
4,559,096 A 12/1985 Friedman et al.
4,624,859 A 11/1986 Akira et al.
4,812,326 A 3/1989 Tsukazaki et al.

(List continued on next page.)

FOREIGN PATENT DOCUMENTS

JP 1-136102 5/1989
JP 6-224156 8/1994

OTHER PUBLICATIONS

Yamada, Proc. 14th Symp. On ISIAT, pp. 227–235 (1991) no month "New Horizons in Material Processing with ICB".

Y. Yamashita et al., Proc. 1st Meeting on IESJ, pp. 247–250 (1992)—no month Tokyo, IonBeam Engineering Experimental Laboratory "Irradiation effects of a Mass Analyzed Gas Cluster Ion Beam on Silicon Substrates".

I. Yamada et al., *Nuclear Instruments and Methods in Physics Research*, B74, pp. 341–346 (1993) no month "Irradiation effects of gas–cluster $CO_2$ ion beams on Si".

(List continued on next page.)

*Primary Examiner*—Marianne Padgett
(74) *Attorney, Agent, or Firm*—Wenderoth,Lind& Ponack,LLP

(57) ABSTRACT

A method of forming a thin film on the surface of a substrate such as silicon, in which a gas cluster (which is a massive atomic or molecular group of a reactive substance taking the gaseous form at room temperature under atmospheric pressure) is formed and then ionized, and the cluster ions are then irradiated onto a substrate surface under an acceleration voltage to cause a reaction.

It is possible to form a high quality ultra-thin film having a very smooth interface, without causing any damage to the substrate, even at room temperature.

9 Claims, 7 Drawing Sheets

U.S. PATENT DOCUMENTS

| | | | |
|---|---|---|---|
| 4,882,023 A | | 11/1989 | Wendman |
| 5,110,435 A | | 5/1992 | Haberland |
| 5,198,262 A | * | 3/1993 | Yamada et al. ............. 427/527 |
| 5,350,607 A | | 9/1994 | Tyson et al. |
| 5,459,326 A | | 10/1995 | Yamada |
| 5,527,731 A | | 6/1996 | Yamamoto et al. |
| 5,584,739 A | * | 12/1996 | Itoh et al. ..................... 445/24 |
| 6,416,820 B1 | * | 7/2002 | Yamada et al. ............. 427/533 |
| 6,486,068 B2 | * | 11/2002 | Yamasaki et al. ........... 438/706 |
| 6,486,478 B1 | * | 11/2002 | Libby et al. ............. 250/492.1 |
| 6,491,800 B2 | * | 12/2002 | Kirkpatrick et al. ........ 427/534 |
| 6,498,107 B1 | * | 12/2002 | Fenner ....................... 438/706 |
| 6,537,606 B2 | * | 3/2003 | Allen et al. .................... 427/9 |
| 6,641,937 B1 | * | 11/2003 | Kiuchi et al. ............... 428/697 |
| 2002/0051846 A1 | * | 5/2002 | Kirkpatrick et al. ........ 427/523 |
| 2002/0139772 A1 | * | 10/2002 | Fenner ........................ 216/60 |

OTHER PUBLICATIONS

J.A. Northby et al., *Nuclear Instruments and Methods in Physics Research*, B74, pp. 336–340 (1993) no month "A Method and Apparatus for Surface modification bygas cluster ion impact".

I. Yamada et al., *Nuclear Instruments and Methods in Physics Research*, B79, pp. 223–226 (1993) no month "Surface modification with gas cluster ion beams".

P.R. Wolfgang Henkes et al., *Vacuum*, 39(8), pp. 541–542, (1989).

O.F. Hagena et al., *The Journal of Chemical Physics*, 56(5), pp. 1793–1802, (1972) Mar. "Cluster Formation in Expanding Supersonic Jets!. . . ".

T. Yamaguchi et al., Nuclear Instruments and Methods in Physics Research, B99, pp. 237–239 (1995).

M. Akizuki et al., Nuclear Instruments and Methods in Physics Research, B99, pp. 229–232 (1995).

* cited by examiner (a)  (b)

Monomer Ions　　　　　　　　　　　Cluster Ions (n>500)

METHOD FOR FORMING THIN FILM WITH A GAS CLUSTER ION BEAM

This is a continuation of Ser. No. 09/916,304, filed Jul. 30, 2001, now abandoned, which is a continuation of Ser. No. 08/946,663, flied Oct. 7, 1997, now abandoned, which is a continuation of Ser. No. 08/757,088, filed Nov. 26, 1996, now abandoned, which is a continuation of Ser. No. 08/523,922, filed September 6, 1995, now abandoned.

FIELD OF THE INVENTION

The present invention relates to a method for forming a thin film on the surface of a substrate with a gas cluster ion beam. More particularly, the present invention relates to a method for forming a thin film by a gas cluster ion beam which is a group of reactive substances gaseous at the room temperature and under atmospheric pressure. The method is useful for the manufacture of a semiconductor or other electronic devices and for surface reforming of a functional material.

PRIOR ART AND PROBLEMS

A method for forming a thin film by irradiating monatomic or monomolecular ions onto a substrate surface has conventionally been used in practice. This method utilizes a high input energy of several keV because low-energy ion irradiation cannot give an adequate beam because of the space charge effect between ions.

In this conventional method, however, the use of ions having a large input energy makes it difficult to avoid damage to the substrate surface, and thus deterioration of semiconductor devices has been a major problem.

As a method for forming a thin film by causing reaction between a reactive substance, which is gaseous at the room temperature, and a semiconductor substrate, a thermal reaction method has been developed for forming an oxide or nitride film by heating the substrate to a high temperature in an atmosphere of the reactive substance. The thin film formed by this method has excellent interface and insulation properties, and the method has been industrialized for forming an insulating film or a capacitor insulating film for silicon semiconductor devices.

This method requires a low temperature to reduce the diffusion of impurities, which is desirable for integrated circuit devices, and the chemical vapor deposition (CVD) method is adopted for this purpose.

In this case, however, it is necessary to heat the substrate surface to a temperature of at least 400° C., but this results in defects such as a low density of the resultant film as compared with that produced by the thermal reaction method and the presence of many unsaturated bonds on the interface between the substrate and the thin film.

The plasma CVD method is known as a method for forming a thin film at a low temperature. This method however involves such defects in that it introduces a large amount of mixed impurities in the substrate, causes damage to the substrate surface by the ions, and results in difficulties controlling the film thickness of an ultra-thin film. Furthermore, it is not applicable to a transistor gate insulating film or a capacitor insulating film requiring high quality.

In the conventional techniques, as described above, the quality of the resultant thin film deteriorates as the process temperature becomes lower, and it is difficult to obtain an ultra-thin film useful for a hyperfine semiconductor circuit device such as ULSI.

There has consequently been a strong demand for a new method which permits formation of a high-quality thin film at a lower temperature, particularly at room temperature, without the need to heat the substrate and without damaging the substrate surface, as a fundamental technology for use in advanced electronics such as ULSI.

The present invention was developed in view of the circumstances as described above, and has an object to provide a method for forming a high-quality ultra-thin film having a smooth interface with the substrate free from a damage at the room temperature, which solves the drawbacks in the conventional methods for forming a thin film.

SUMMARY OF THE INVENTION

The present invention provides a method for forming a thin film on the surface of substrate with a gas cluster ion beam, which comprises the step of irradiating the surface of a substrate with ions of a gas cluster (which is a massive group of atoms or molecules of a reactive substance in gaseous form at room temperature and under atmospheric pressure) to cause a reaction with a substance of the substrate surface, thereby forming a thin film on the substrate surface.

More specifically, the invention comprises the steps of using a reactive substance selected from the group consisting of oxides, nitrides, carbides, mixtures thereof, and mixtures thereof with an inert gas and causing a reaction between a gas cluster ion beam of this substance and a substance of the substrate surface, thereby forming a thin film on the substrate surface.

The invention provides also a method for forming a thin film based on a gas cluster ion beam, which comprises the steps of irradiating the surface of the substrate with a gas cluster ion beam to form a thin film and at the same time to planarize the surface.

DETAILED DESCRIPTION OF THE INVENTION

The method of the invention comprises generating a gas cluster (which is a massive group of atoms or molecules of a reactive substance which is a gas at room temperature under atmospheric pressure), irradiating electrons onto this gas cluster to ionize same, and irradiating the thus generated gas cluster ions onto a substrate surface by selecting a beam of a particular size as required.

Irradiation is accomplished by accelerating the gas cluster ions under an acceleration voltage. Because a cluster usually consists of a group of several hundred atoms or molecules, each atom or molecule is irradiated as an extra-low temperature ion beam with UP to several tens of eV and even under an acceleration voltage of 10 kV. It is therefore possible to form a high-quality ultra-thin film with a very low degree of damage at room temperature. A thin film with the slightest content of impurities can be produced as the impurities are removed from the substrate surface by the effect of the gas cluster ions.

Another effective manner of irradiation is to appropriately select the number of component molecules in response to the substrate, the kind of substance of the substrate surface and the desired thin film composition.

The cluster itself can be generated by ejecting a pressurized gas through an expansion type nozzle into a vacuum unit, as already proposed by the present inventors. The thus generated cluster can be ionized by irradiating electrons.

In the present invention, the gas cluster ions are irradiated onto a substrate surface to planarize the surface and at the same time, the irradiated ions are caused to react with the substance of the substrate surface, thereby permitting formation of a thin film on the substrate surface.

The gaseous reactive substances taking a gaseous form at room temperature under the atmospheric pressure include, for example, oxygen, oxides such as $CO_2$, $CO$, $N_2O$, $NO_x$, and $C_xH_yO_z$, carbides, nitrides such as $N_2$ and $NH_x$, sulfides, halides, hydrides such as $AsH_x$ and $SiH_x$, organometallic compounds such as metal carbonyls.

In the present invention, for example, the reactive substance is preferably oxygen or a carbon oxide, or a mixture thereof, or a mixture thereof with an inert gas substance, and the thin film formed can be an oxide film.

In the case of any of the gases including oxygen ($O_2$) and nitrogen ($N_2$), the present invention specifically proposes a method for generating gas cluster ions, which comprises the step of generating a gas cluster by means of a nozzle cooled by a coolant, and ionizing the resultant cluster.

The invention will be described in further detail by the following of examples.

EXAMPLE 1

Figure 1:
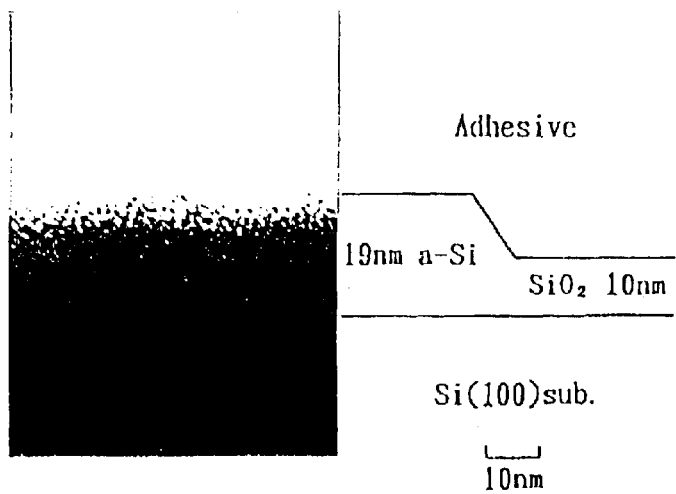
FIG. 1 shows transmission type electron microscopic photomicrographs of a section of a silicon substrate by irradiating $CO_2$ monomers and $CO_2$ cluster ions onto the substrate surface thereof.
Figure 1:
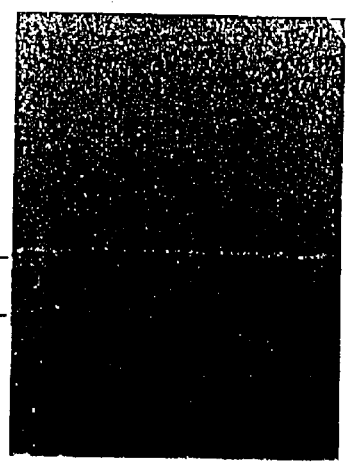

FIG. 1 is transmission type electron microscopic photomicrographs of a silicon substrate section when (a) $CO_2$ monomolecular ions were irradiated onto an silicon substrate at a dose rate of $1\times10^{16}$ ions/cm$^2$, and (b) $CO_2$ cluster ions having a number of component molecules (cluster size) of at least 500 were irradiated.

In FIG. 1 (a), $CO_2$ monomolecular ions were irradiated under an acceleration voltage of 10 kV onto a silicon (001) substrate. An amorphous silicon layer of a thickness of 19 nm was formed on the substrate surface, and irregularities occurred on the interface between the amorphous layer and the substrate. The amorphous silicon layer is a damaged layer formed when $CO_2$ ions ejected onto the substrate surface hit atoms of the substrate. These irregularities of the interface and the damaged layer, causing deterioration of semiconductor device properties, must be converted to monocrystalline state. It is however very difficult to achieve complete conversion even through heat treatment at a temperature of at least 800° C.

In the case of FIG. 1(b), on the other hand, $CO_2$ cluster ions having a number of component atoms (cluster size) of at least 500 were accelerated under conditions including a dose rate of $1\times10^{16}$ ions/cm$^2$ and an acceleration voltage of 10 kV, and then, only clusters of a number of component molecules of at least 500 were irradiated onto a silicon (001) substrate at room temperature by the retarding-field method. A silicon oxide film having a thickness of 10 nm was formed on the substrate surface, and no damaged layer was observed between the silicon oxide film and the silicon substrate, and the interface in between was very smooth.

Figure 2:
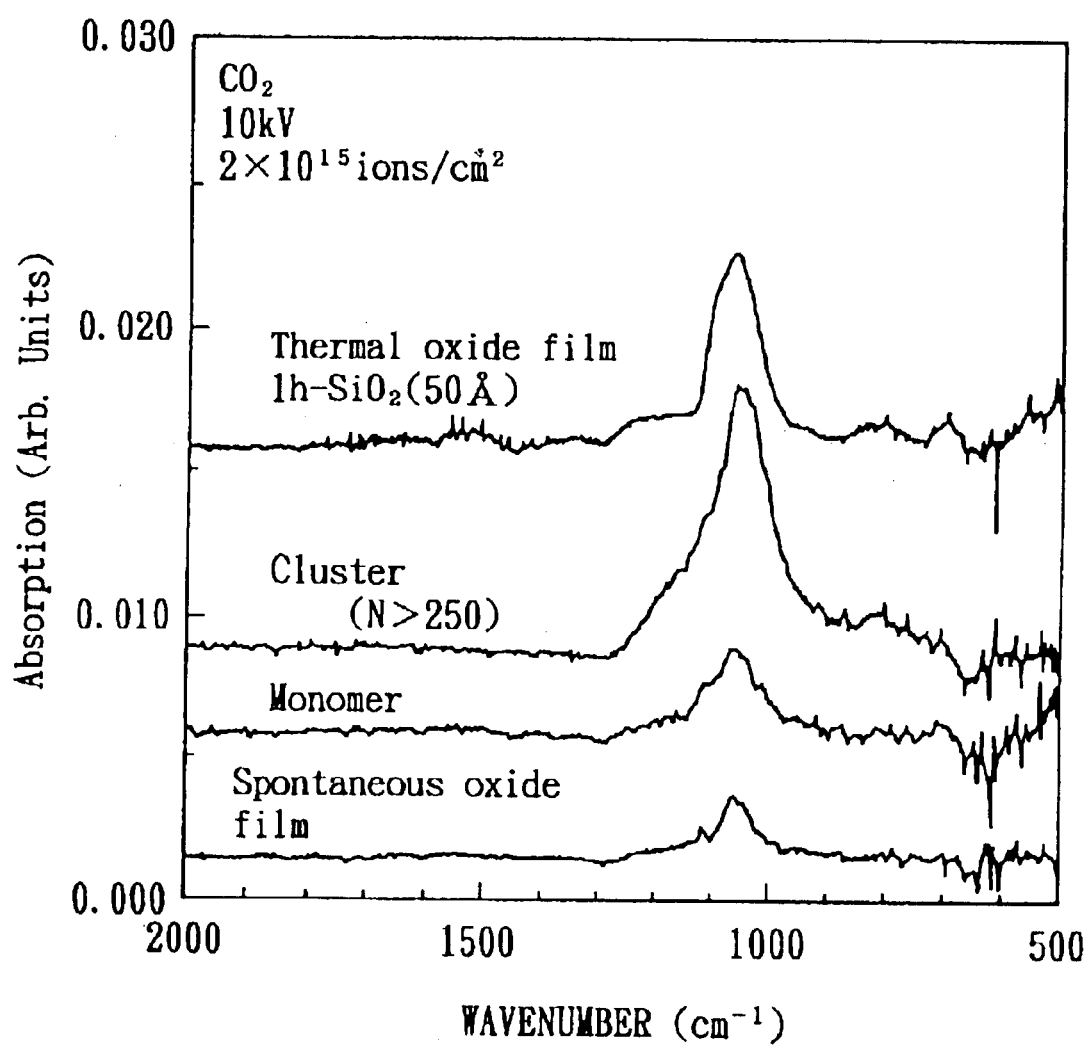
FIG. 2 shows an infrared absorption spectrum of a thin film formed by irradiating $CO_2$ monomer ions and $CO_2$ cluster ions onto a silicon substrate surface.

The above-mentioned findings are confirmed also from FIG. 2. FIG. 2 is an infrared absorption spectrum of a thin film formed by irradiating $CO_2$ monomer ions and cluster ions under conditions including an acceleration voltage of 10 kV and a dose rate of $2\times10^{16}$ ions/cm$^2$ onto a silicon substrate surface. While a silicon oxide film only of the order of spontaneous oxide film can be formed by irradiation with $CO_2$ monomer ions, irradiation with cluster ion's permits formation of an oxide film of about 70 Å.

EXAMPLE 2

Figure 3:
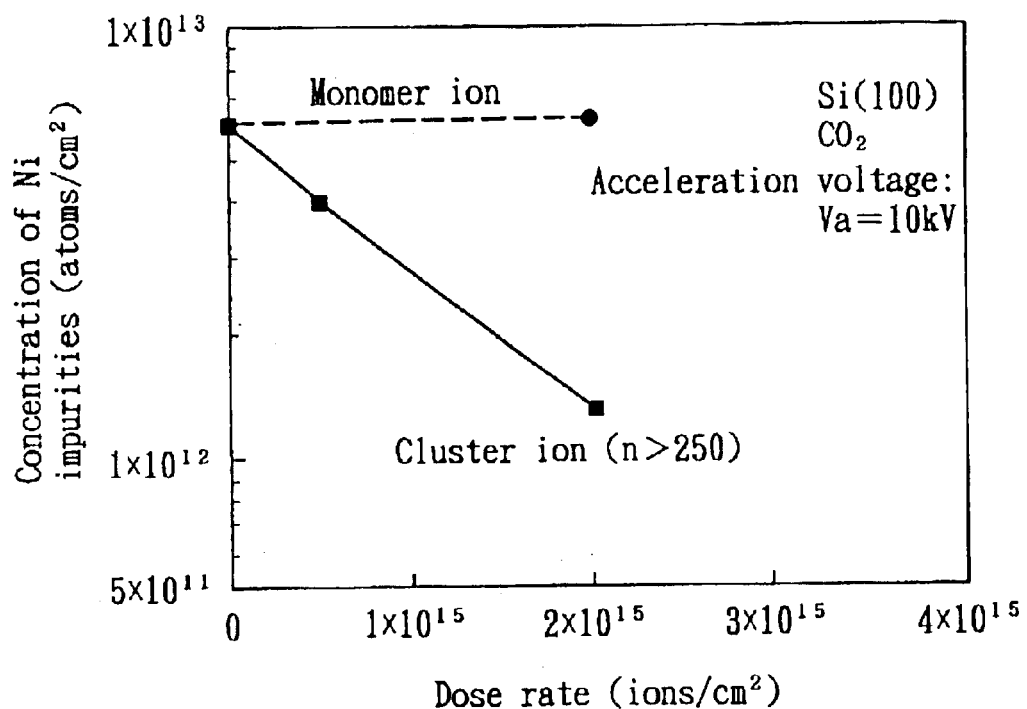
FIG. 3 shows a chart illustrating the relationship between the dose rate of $CO_2$ ions to be irradiated and the concentration of impurities in the substrate surface.

FIG. 3 illustrates changes in the concentration of Ni impurities as measured with various dose rates of $CO_2$ ions irradiated onto a silicon substrate, ranging from 0 to $2\times10^{15}$ ions/cm$^2$. In this case, $CO_2$ cluster ions having a number of component molecules of at least 250 and $CO_2$ monomer ions were irradiated under an acceleration voltage of 10 kV onto the silicon substrates to which Ni had previously been forcedly deposited to give of $6\times10^{12}$ atoms/cm$^2$, and changes in the concentration of Ni impurities was measured before and after irradiation through measurement by the total reflection X-ray flourescence analysis method. While the concentration of Ni impurities does not depend upon the extent of dose rate in the irradiation of monomer ions, the concentration of Ni impurities decreases along with the increase in the dose rate in the irradiation of cluster ions.

As is clear from these results, in the case of irradiation of cluster ions, it is possible to reduce the concentration of impurities by increasing the dose rate of irradiated ions. The higher impurities-removing effect in the irradiation of cluster ions as compared to the irradiation of monomer (monomolecular) ions is attributable to the fact that, while embedding of impurities adhering to the surface into the interior of the substrate occurs in the irradiation of monomer ions, sputtering from the irradiation onto the substrate preferentially eliminates impurities on the substrate surface in the irradiation of cluster ions.

As described above, the method of the present invention, permitting formation of a clean surface free from defects on the substrate surface, makes it possible to manufacture a high-quality thin film with the slightest content of impurities, useful for a semiconductor circuit device.

EXAMPLE 3

Table 1 shows, for an $SiO_2$ film formed on a polycrystalline silicon film irradiated with $CO_2$ cluster ions under conditions including an acceleration voltage of 10 kV and a dose rate of $5\times10^{15}$ ions/cm$^2$, the film thickness and the average surface roughness before and after a treatment with fluoric acid solution. The treatment with fluoric acid solution was applied until complete elimination of the $SiO_2$ film. For comparison purposes, values obtained with a polycrystalline silicon film not irradiated with cluster ions are also shown.

TABLE 1

| Kind of sample | Thickness of SiO$_2$ thin film (nm) | Average surface roughness (unit: Å) | |
|---|---|---|---|
| | | Before fluoric acid treatment | After fluoric acid treatment |
| Sample not irradiated | — | 37 | 37 |
| Sample irradiated with cluster ions of size of 250 | 8 | 7 | 9 |
| Sample irradiated with cluster ions of size of 500 | 6 | 18 | 20 |

The sample not irradiated with cluster ions has an average surface roughness of 37 Å, and this value does not vary with the fluoric acid treatment. Irradiation of cluster ions of a size of 250 and 500 reduces the average surface roughness of the polycrystalline silicon film to 7 Å and 18 Å, respectively. At the same time, an SiO$_2$ thin film having a thickness of from 8 to 6 nm is formed on the surface of the polycrystalline silicon film, thus forming an SiO$_2$ thin film simultaneously with planarization. A satisfactory surface planarity is kept with almost no change by the fluoric acid treatment. Thus, the irradiation of CO$_2$ cluster ions permits formation of a silicon oxide film which has a planar surface, with a smooth interface between said film and the silicon substrate, and has a uniform thickness.

EXAMPLE 4

Figure 4:
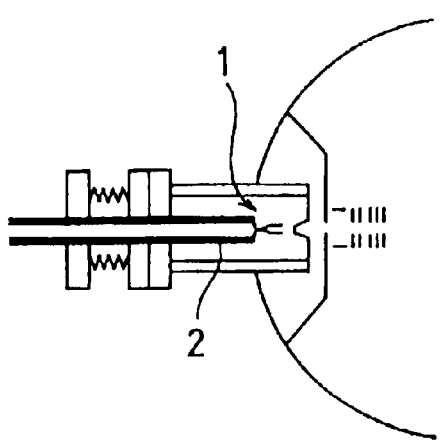
FIG. 4 shows a diagram illustrating the generation of clusters of various gases by means of a nozzle having cooling means.

Conditions for generating clusters of various gases were evaluated. As shown in FIG. 4, cooled dry nitrogen gas was passed through a piping (2) attached to a nozzle (1) section which was then cooled. This permitted ionization of a cluster of gases which had not been possible at room temperature.

Figure 5:
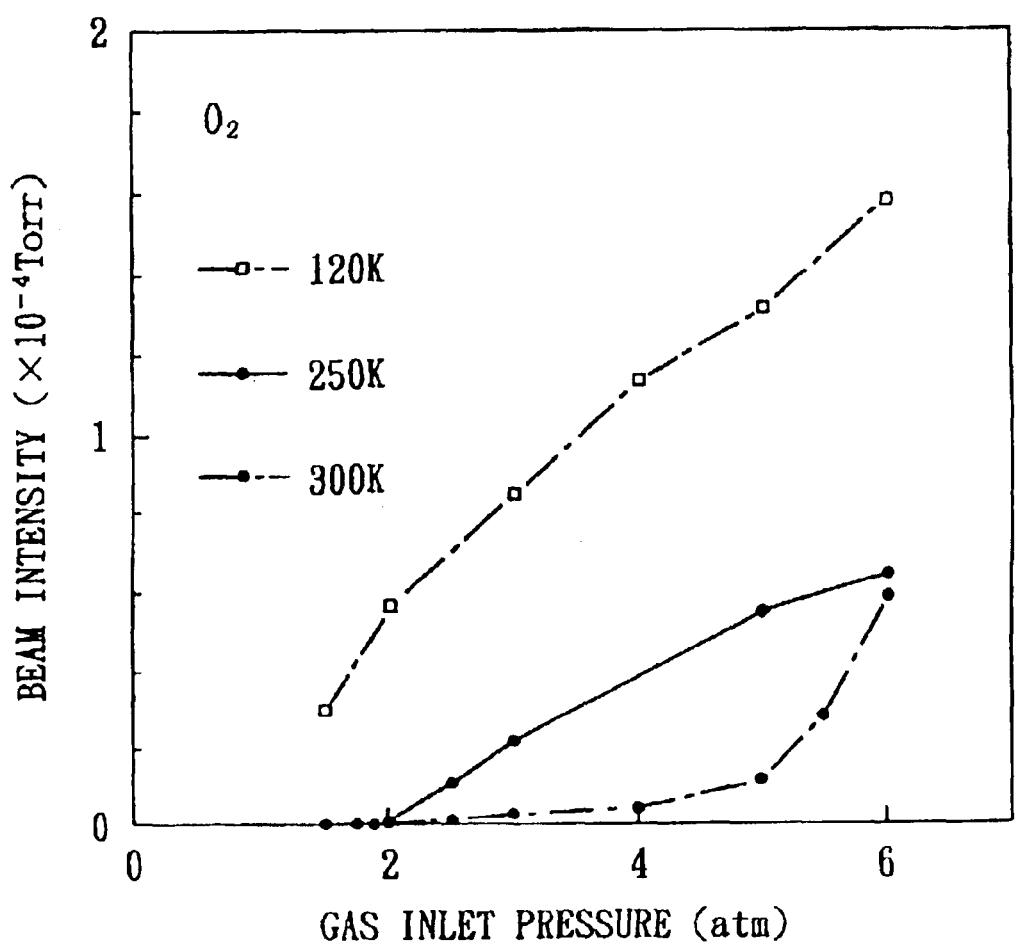
FIG. 5 shows a graph illustrating the relationship between the supply pressure and the cluster beam intensity at various nozzle intensities for oxygen gas.
Figure 6:
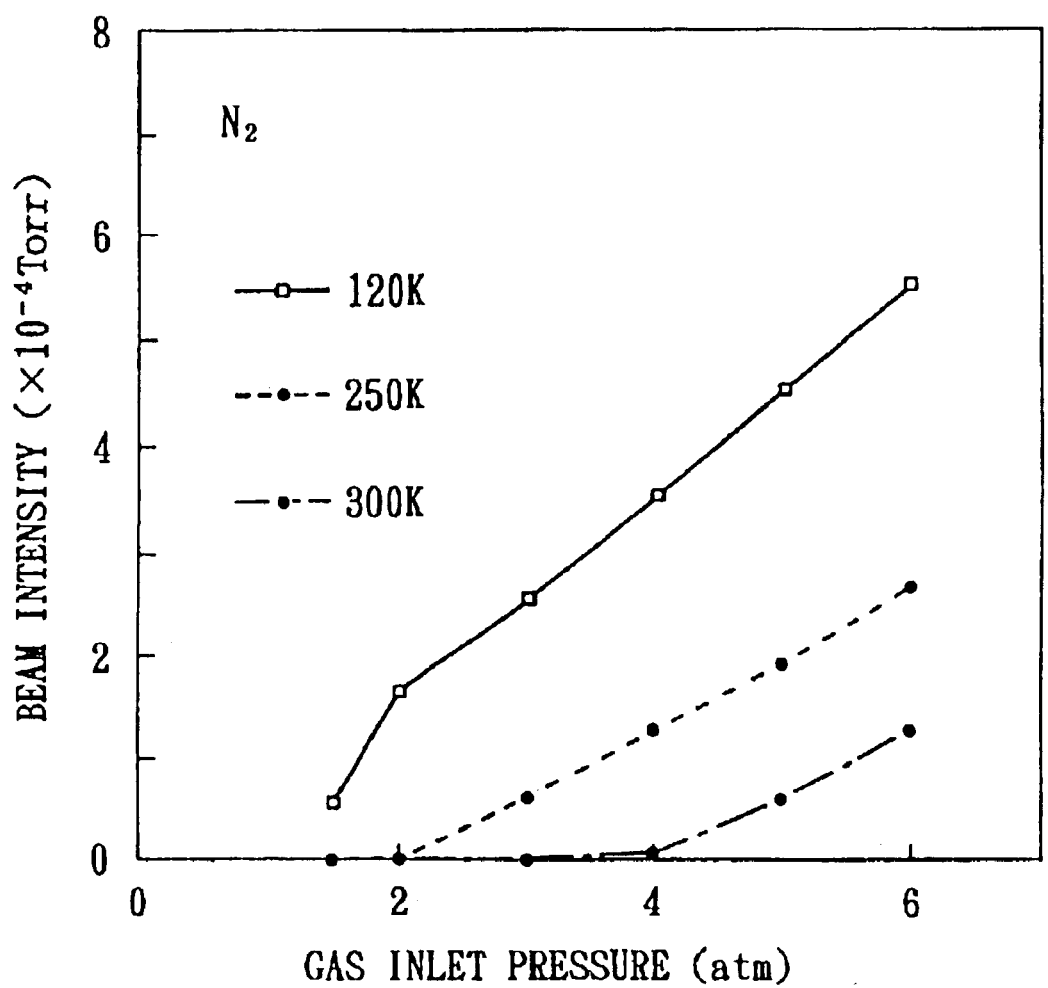
FIG. 6 shows a graph illustrating the relationship between the supply pressure and the cluster beam intensity at various nozzle intensities for nitrogen gas.
Figure 7:
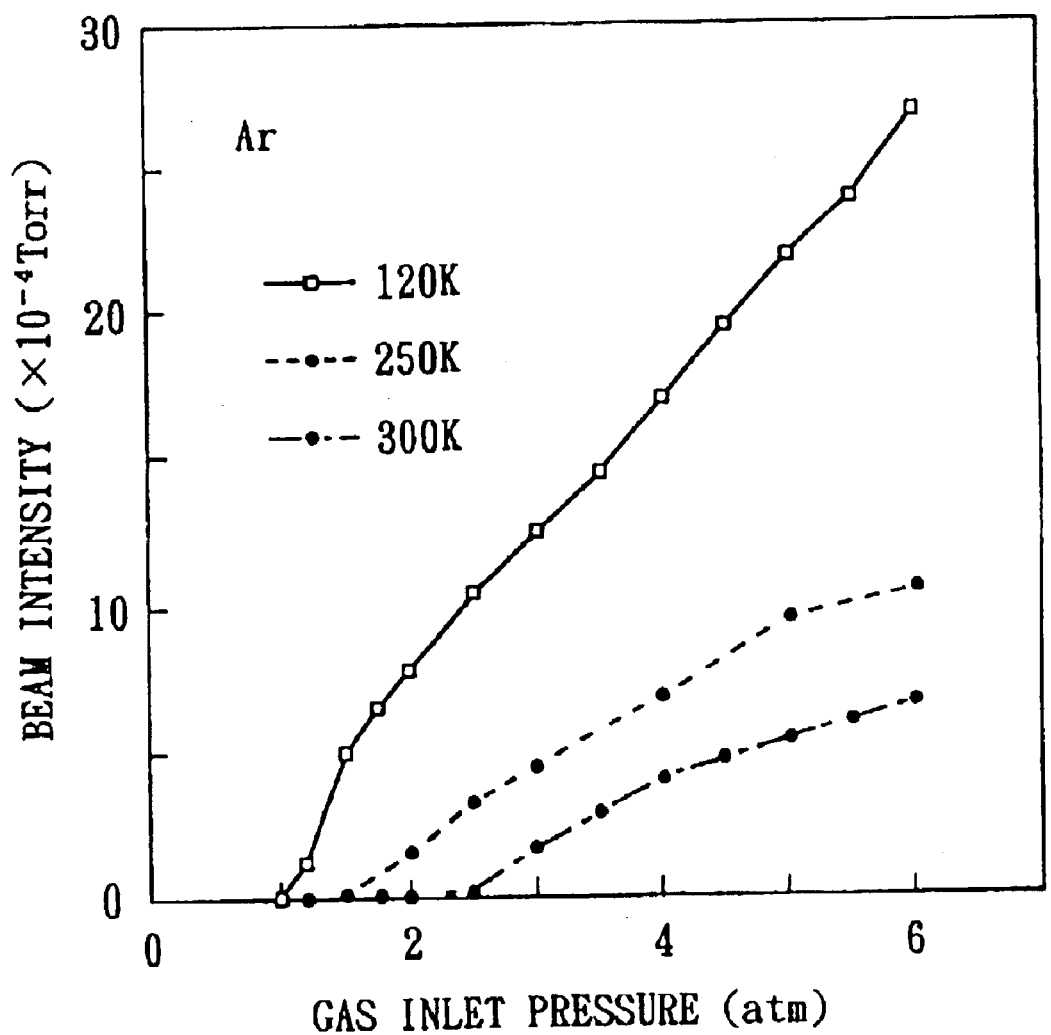
FIG. 7 shows a graph illustrating the relationship between the supply pressure and the cluster beam intensity at various nozzle intensities for argon gas for reference.

FIG. 5 is a graph illustrating the relationship between the intensity of an oxygen (O$_2$) gas cluster beam and the supply pressure at various nozzle temperatures. FIG. 6 is a graph illustrating such relationship for nitrogen (N$_2$) gas. FIG. 7 illustrates the relationship for Ar gas for reference.

These results suggest the possibility of determining the degree of easiness of generation of the cluster of a gas applicable in the present invention by means of the following formula:

Easiness of generation of cluster $$\Psi = P_0 \cdot d_0 \cdot (T_b/T_N) \gamma / (\gamma - 1)$$

where, $P_0$: gas supply pressure,
 $d_0$: inside diameter of nozzle throat,
 $T_b$: boiling point of gas,
 $T_N$: ejecting temperature of gas,
 $\gamma$: ratio of specific heats of gas (specific heat at constant pressure/isometric specific heat).
 Larger $P_0$ or $T_b$ leads to easier generation of clusters.
 Smaller $T_N$ or $\gamma$ corresponds to easier generation of clusters.

In all the cases described above, various gases were effectively utilized for the formation of thin films.

EXAMPLE 5

Figure 8:
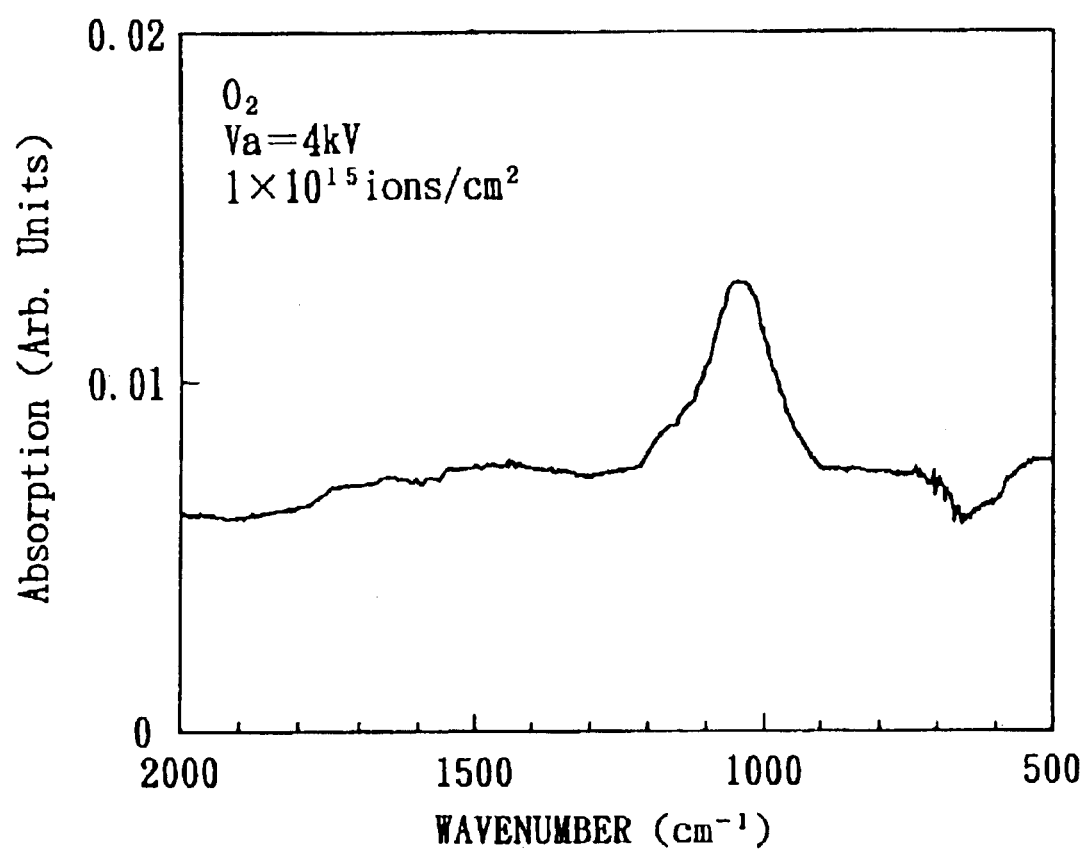
FIG. 8 shows an infrared absorption spectrum of an oxide film formed by irradiating oxygen ($O_2$) gas cluster onto a silicon substrate surface.

FIG. 8 is an infrared absorption spectrum of a thin film formed by irradiating O$_2$ cluster ions having a number of component molecules (cluster size) of at least 250 onto an Si substrate surface at room temperature under an acceleration voltage of 4 kV and at a dose rate of $1 \times 10^{15}$ ions/cm$^2$. It is clear from FIG. 8 that an oxide film of about 40 Å was formed with a lower acceleration voltage and a lower dose rate than the conditions for irradiation of CO$_2$ cluster ions.

EXAMPLE 6

Table 2 shows the results of investigation by the photoelectron spectroscopy method of an oxide film formed by irradiating CO$_2$ cluster ions and O$_2$ cluster ions under the same irradiating conditions including an acceleration voltage of 4 kV, a cluster size of at least 250, and a dose rate of $1 \times 10^{15}$ ions/cm$^2$. The results of investigation on a clean Si substrate not irradiated are also shown for reference. By using O$_2$ cluster ions, it is possible to form a thicker oxide film as compared with the case of CO$_2$ cluster ions. It is also clear that the relative intensity of emission spectrum from C1s core level of the oxide film formed by the irradiation of O$_2$ clusters is of the same order as that for a substrate not irradiated and the carbon content is almost nil, even with the largest film thickness. When the presence of residual carbon in the film is not desired, it is suggested to use O$_2$ cluster ions to obtain a thicker oxide film.

TABLE 2

| Raw material gas of irradiated cluster ions | Oxide film thickness (unit: Å) | Relative intensity of C1s signal |
|---|---|---|
| O$_2$ | 40 | 31 |
| CO$_2$ | 18 | 44 |
| Substrate not irradiated | 8 | 29 |

According to the present invention, as described above in detail, it is possible to form a high-quality reactive ultra-thin film, with no damage to the substrate, having a very smooth interface, even at the room temperature, by irradiating cluster ions of a reactive substance onto the substrate surface to cause a reaction.

What is claimed is:

1. A method for forming a thin film on a surface of a substrate with a gas cluster ion beam, which comprises irradiating the surface of a substrate with ions of a gas cluster of a gas comprising oxygen (O$_2$) and optionally an inert gas, to cause a reaction of said ions of the gas cluster with the surface of the substrate to thereby form the thin film on the substrate surface, said gas cluster being a cluster of atoms or molecules which are in a gaseous state at room temperature and under atmospheric pressure, which when ionized to form said gas cluster beam, react with the surface of the substrate.

2. The method as claimed in claim 1, wherein the said gas cluster is formed from said oxygen in admixture with an inert gas.

3. The method as claimed in claim 1, wherein the gas cluster ions are selected in terms of a number of component molecules, dependent upon the chemical composition of the substrate, to produce the thin film on the substrate.

4. The method as claimed in claim 1, wherein impurities present on the substrate are removed by the irradiation with the gas cluster ion beam, thereby forming said thin film with a lower content of impurities than before said irradiation.

5. The method as claimed in claim 1, wherein the substrate surface is flattened by the irradiation with the gas cluster ions, at the same time as the thin film is formed.

6. The method as claimed in claim 1, wherein the thin film formed is an oxide.

7. The method as claimed in claim 1, wherein the substrate is silicon.

8. The method as claimed in claim 1, wherein the gas cluster is generated by supplying a pressurized gas to an expansion type nozzle cooled by a coolant.

9. A method for forming a thin film on a surface of a substrate with a gas cluster ion beam, said gas cluster comprising oxygen ($O_2$) and optionally an inert gas, which includes the steps of:

(i) forming said gas cluster from a substance which, upon being ionized, is reactive with the surface of the substrate, (ii) ionizing the gas cluster to form said gas cluster ions, and (iii) irradiating the surface of the substrate with said gas cluster ion beam.

* * * * *